United States Patent
Seyama et al.

(10) Patent No.: US 10,350,692 B2
(45) Date of Patent: Jul. 16, 2019

(54) HEATER FOR BONDING APPARATUS AND METHOD OF COOLING THE SAME

(71) Applicant: Shinkawa Ltd., Tokyo (JP)

(72) Inventors: Kohei Seyama, Tokyo (JP); Yasuhiro Chida, Tokyo (JP); Osamu Kakutani, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/597,635

(22) Filed: Jan. 15, 2015

(65) Prior Publication Data

US 2015/0183040 A1 Jul. 2, 2015

Related U.S. Application Data

(63) Continuation of application No. PCT/JP2013/060908, filed on Apr. 11, 2013.

(30) Foreign Application Priority Data

Jul. 20, 2012 (JP) ................................. 2012-161304

(51) Int. Cl.
*B23K 3/08* (2006.01)
*H01L 23/00* (2006.01)
(Continued)

(52) U.S. Cl.
CPC ............ *B23K 3/085* (2013.01); *B23K 1/0016* (2013.01); *B23K 3/047* (2013.01); *H01L 24/75* (2013.01);
(Continued)

(58) Field of Classification Search
CPC ........... H05B 3/141; H05B 3/26; H01L 24/75; H01L 2224/75502; B23K 3/047; B23K 3/085
(Continued)

(56) References Cited

U.S. PATENT DOCUMENTS 5,453,641 A * 9/1995 Mundinger ............... F28D 9/00
165/104.21
5,592,363 A 1/1997 Atarashi et al.
(Continued)

FOREIGN PATENT DOCUMENTS

JP 10-275833 10/1998
JP 11-204994 7/1999
(Continued)

OTHER PUBLICATIONS

International Search Report dated Jul. 9, 2013, from corresponding International Application No. PCT/JP2013/060908.
(Continued)

*Primary Examiner* — Tu B Hoang
*Assistant Examiner* — Erin E McGrath
(74) *Attorney, Agent, or Firm* — Katten Muchin Rosenman LLP

(57) ABSTRACT

Provided is a plate-like heater for a bonding apparatus (30) including: a lower surface (31*b*) to which a bonding tool (40) is attached; and an upper surface (31*a*) to which a heat insulator (20) is attached. The upper surface (31*a*) is provided with a large number of capillary slits (35), and the large number of capillary slits (35) and a matching surface (21) of the heat insulator (20) attached to the upper surface (31*a*) form a large number of capillary coolant flow-paths (37) each extending from a cavity (36) to a lateral surface (33). This allows effective cooling of the heater for a bonding apparatus.

9 Claims, 8 Drawing Sheets

(51) Int. Cl.
  *B23K 3/047* (2006.01)
  *H05B 3/14* (2006.01)
  *H05B 3/26* (2006.01)
  *B23K 1/00* (2006.01)
  *B23K 101/42* (2006.01)

(52) U.S. Cl.
  CPC .............. *H05B 3/141* (2013.01); *H05B 3/26* (2013.01); *B23K 2101/42* (2018.08); *H01L 2224/75502* (2013.01)

(58) Field of Classification Search
  USPC ........................................................ 219/531
  See application file for complete search history.

(56) References Cited

U.S. PATENT DOCUMENTS

| | | | | |
|---|---|---|---|---|
| 9,434,029 B2* | 9/2016 | Li | ........................... | F25B 21/02 228/200 |
| 9,943,931 B2* | 4/2018 | Li | ........................... | H01L 24/81 228/46 |
| 2002/0003137 A1 | 1/2002 | Yokoyama et al. | | |
| 2004/0065881 A1* | 4/2004 | Ito | ..................... | H01L 21/67103 257/48 |
| 2007/0125526 A1 | 6/2007 | Satou et al. | | |
| 2007/0131659 A1 | 6/2007 | Durocher et al. | | |
| 2009/0184152 A1* | 7/2009 | Kimbara | .............. | B23K 1/0016 228/111 |
| 2011/0092072 A1* | 4/2011 | Singh | .................... | C23C 14/541 438/710 |
| 2012/0014066 A1* | 1/2012 | Morino | ................. | H01L 23/473 361/707 |
| 2012/0091108 A1* | 4/2012 | Lin | ..................... | H01L 21/6831 219/201 |

FOREIGN PATENT DOCUMENTS

| | | |
|---|---|---|
| JP | 2002-16091 | 1/2002 |
| JP | 2004-63947 | 2/2004 |
| JP | 2007-165897 | 6/2007 |
| JP | 2007-180505 | 7/2007 |
| JP | 2007-242724 | 9/2007 |
| JP | 2007-329306 | 12/2007 |
| WO | 2012/002300 A1 | 1/2012 |

OTHER PUBLICATIONS

Written Opinion of the International Searching Authority dated Dec. 24, 2013, from corresponding International Application No. PCT/JP2013/060908.

* cited by examiner

HEATER FOR BONDING APPARATUS AND METHOD OF COOLING THE SAME

TECHNICAL FIELD

The present invention relates to a structure of a heater for a bonding apparatus and a method of cooling this heater.

BACKGROUND ART

Examples of a method of mounting a semiconductor chip on a substrate that have been employed include: a method of mounting an electronic component with a soldering bump, in which a soldering bump is provided for an electrode, on a substrate by thermal bonding; gold solder welding of providing a gold bump for an electrode of an electronic component, providing thin soldering film over a surface of a copper electrode of a substrate, and performing thermal welding between gold in the gold bump and the solder; and a joining method using a resin based adhesive material such as a thermoplastic resin or an anisotropic conductive film (AFC). Any of these methods includes heating an electronic component, pressing the electronic component onto a substrate using a bonding tool in a state in which soldering or an adhesive agent on an electrode is molten, cooling and fixing the soldering or the adhesive material, and thus joining the electronic component to the substrate. An electronic component mounting apparatus used in such joining is provided with a heater for heating the soldering to a molten state or the adhesive agent to a softened state, and cooling means for cooling the soldering or the adhesive agent after joining, and is required to perform quick heating and quick cooling.

In order to reduce takt time, reduction of cooling time is a matter of concern rather than quick heating. Accordingly, there is proposed a method of cooling a heater and a bonding tool attached to the heater by providing an air flow-path for a heat insulator that is laid over the plate-like ceramic heater, and causing coolant air to flow over a surface of the ceramic heater (see PTL 1, for example).

Further, there is proposed a method of quickly cooling a pulse heater by providing a space between the pulse heater and a base member laid over the pulse heater, and blowing air from a cooling hole provided in the base member to a surface of the pulse heater on a side of a heat insulator (see PTL 2, for example).

CITATION LIST

Patent Literatures

PTL 1: Japanese Unexamined Patent Application Publication No. 2002-16091
PTL 2: Japanese Unexamined Patent Application Publication No. H10-275833

SUMMARY OF INVENTION

Technical Problem

It should be noted that when fluid flows between narrow parallel plates, a dominant direction of heat transfer from surfaces of the parallel plates to a cooling medium is perpendicular to the flow, and heat transfer like a disturbed flow that is accompanied by transfer of materials is very small. Accordingly, in order to increase an amount of heat transfer between the surfaces of the parallel plates and the cooling medium, a distance between the parallel plates, that is, a distance of thermal conduction in the cooling medium is important. In particular, when air with low thermal conductivity is used as the cooling medium (e.g., thermal conductivity of air from 0.1 Mpa to 0.5 Mpa is 0.026 W/(m·K), which is much smaller than 0.6 W/(m·K) of water), it is necessary to make the distance between the parallel plates even smaller. Accordingly, there is a problem that it is not possible to effectively cool the heater by causing air to flow through a rectangular path whose distance between the parallel plates is on the order from 0.5 mm to 2 mm as in the conventional technique described in PTL 1. Further, there is a problem that a bonding atmosphere is disturbed by air that is blown out, as it is necessary to have a large amount of air to be blown to the base member when the heater is cooled by blowing air to the surface of the heater as in the conventional technique described in PTL 2.

An object of the present invention is to provide effective cooling of a heater for a bonding apparatus.

Solution to Problem

A heater for a bonding apparatus according to the present invention includes: a first surface to which a bonding tool is attached; a second surface on an opposite side of the first surface to which second surface a heat insulator is attached; and a large number of capillary slits provided in the second surface. The large number of capillary slits and a matching surface of the heat insulator attached to the second surface form a large number of capillary coolant flow-paths.

In the heater for a bonding apparatus according to the present invention, it is preferable that the capillary slits have a width along the second surface smaller than a depth in the second surface in a vertical direction.

In the heater for a bonding apparatus according to the present invention, it is further preferable that the second surface is provided with a depression near a center thereof, the depression and the matching surface of the heat insulator attached to the second surface form a cavity into which coolant air flows, and each of the large number of capillary slits extends from the cavity to a lateral surface, or that the heat insulator is provided with a second depression near a center of the matching surface, the second depression and the second surface form a cavity into which coolant air flows, and each of the large number of capillary slits is communicated with the cavity, and extends between opposing lateral surfaces.

A method of cooling a heater for a bonding apparatus cools a plate-like heater for a bonding apparatus including: a first surface to which a bonding tool is attached; a second surface on an opposite side of the first surface to which second surface a heat insulator is attached; and a large number of capillary slits provided in the second surface, the large number of capillary slits and a matching surface of the heat insulator attached to the second surface defining a large number of capillary coolant flow-paths. A flow rate of coolant air is controlled such that a temperature of the coolant air in a center of the capillary slits at outlets of the capillary coolant flow-paths is lower than a surface temperature of the capillary slits by a predetermined threshold value.

Advantageous Effect of Invention

The present invention provides an effect of allowing effective cooling of a heater for a bonding apparatus.

BRIEF DESCRIPTION OF DRAWINGS

FIG. 2($b$) is a sectional view taken along line A-A in FIG. 2($a$).

FIG. 2($c$) is a sectional view taken along line B-B in FIG. 2($a$).

FIG. 7($b$) shows positions at which the air temperature within the capillary coolant flow-paths corresponds to a temperature $T_2$ of wall surfaces (wall surfaces of the capillary slits).

FIG. 9$b$ shows a sectional view of the heater for a bonding apparatus according to the different embodiment of the present invention.

FIG. 9$c$ shows a sectional view of the heater for a bonding apparatus according to the different embodiment of the present invention.

DESCRIPTION OF EMBODIMENTS

Figure 1:
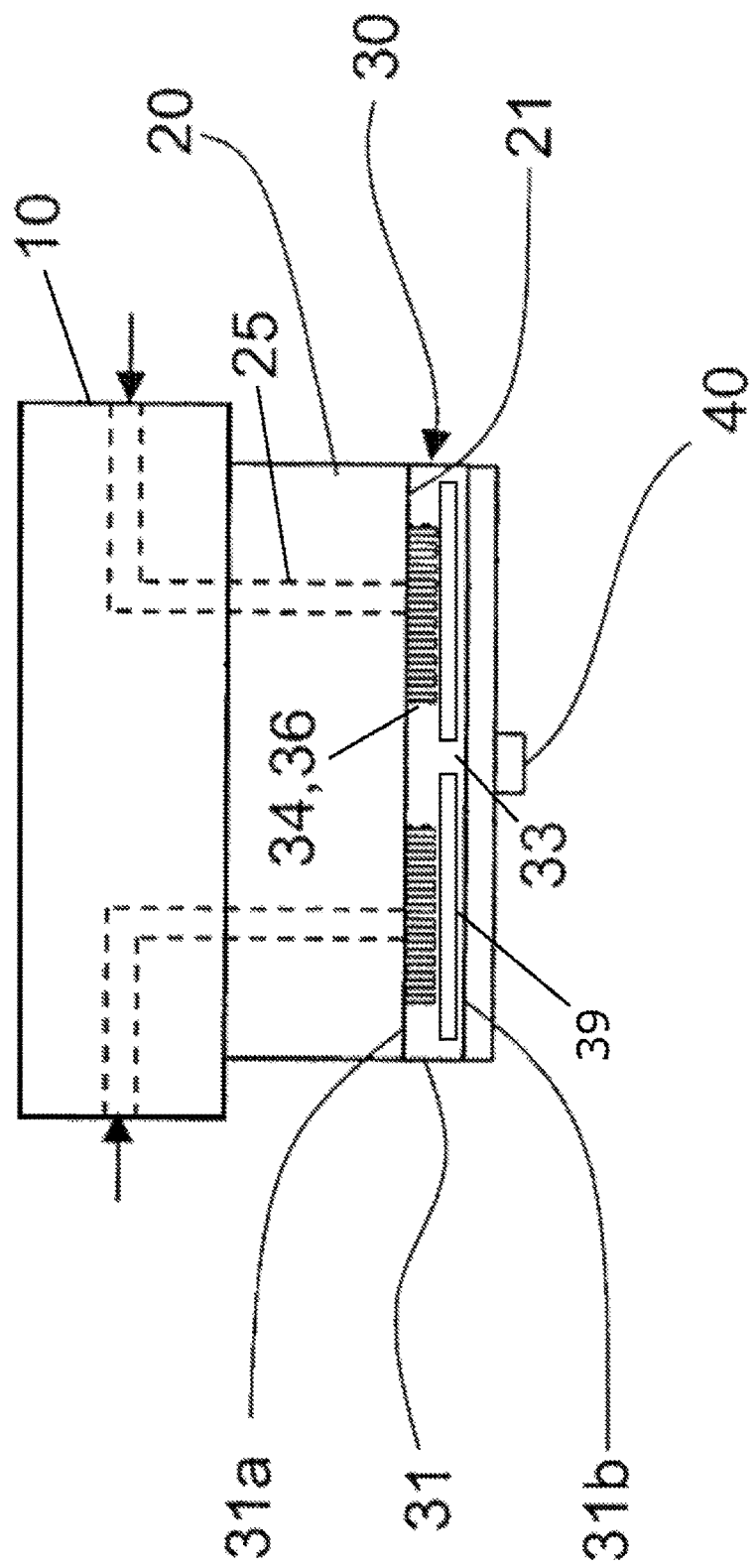
FIG. 1 is an illustrative diagram illustrating a configuration of a heater for a bonding apparatus according to an embodiment of the present invention.

Hereinafter, a heater for a bonding apparatus according to an embodiment of the present invention will be described with reference to the drawings. Referring to FIG. 1, a heater for a bonding apparatus 30 according to this embodiment is provided with a plate-like main body 31, a lower surface 31$b$ as a first surface to which a bonding tool 40 is attached, and an upper surface 31$a$ as a second surface to which a heat insulator 20 is attached. The upper surface 31$a$ is provided with substantially cuboid depressions 34 near the center of the surface, and the main body 31 is provided with large number of capillary slits 35 each extending from the corresponding depression 34 to either of lateral surfaces 33. Each of the depressions 34 and a matching surface 21 of the heat insulator 20 that matches the upper surface 31$a$ form a cavity 36 into which coolant air flows. The large number of capillary slits 35 and the matching surface 21 of the heat insulator 20 attached to the upper surface 31$a$ form a large number of capillary coolant flow-paths 37 each extending from the cavity 36 to either of the lateral surfaces 33.

To an upper part of the heat insulator 20, a stainless-steel base member 10 is attached. The base member 10 is also attached to a bonding head of a bonding apparatus that is not depicted, and the base member 10, the heat insulator 20, the heater for a bonding apparatus 30, and the bonding tool 40 are together moved in a vertical direction by a vertical driving device mounted within the bonding head.

The heater for a bonding apparatus 30 is configured, for example, such that an exothermic resistance body 39 made of such as platinum or tungsten is embedded within ceramic such as aluminum nitride. Further, the heat insulator 20 is provided in order to prevent transmission of heat from the heater for a bonding apparatus 30 to the base member 10, and made for example of ceramic such as Adceram (registered trademark).

Structures of the heater for a bonding apparatus 30 and the heat insulator 20 will be described in detail with reference to FIGS. 2($a$)-2($c$). FIG. 2($a$) is a plan view illustrating the upper surface 31$a$ of the heater for a bonding apparatus 30, FIG. 2($b$) is a sectional view taken along line A-A in FIG. 2($a$), and FIG. 2($c$) is a sectional view taken along line B-B in FIG. 2($a$).

As illustrated in FIG. 2($a$), the two depressions 34 are provided for the upper surface 31$a$ of the heater for a bonding apparatus 30 in a central portion in the vertical direction, and each of the large number of capillary slits 35 extends from a vertical wall of the depressions 34 through the main body 31 to either of the lateral surfaces 33. In the heater for a bonding apparatus 30 according to this embodiment, 63 of the capillary slits 35 extend from the vertical walls of the depressions 34 to the corresponding lateral surfaces 33 of the main body 31 in the vertical direction. Therefore, a total number of the capillary slits 35 provided for the upper surface 31$a$ illustrated in FIG. 2($a$) is 63×2×2=252. Further, a length of the capillary slits 35 is $L_1$. The capillary slits 35 can be formed by cutting, for example, using a dicing device.

Figure 3:
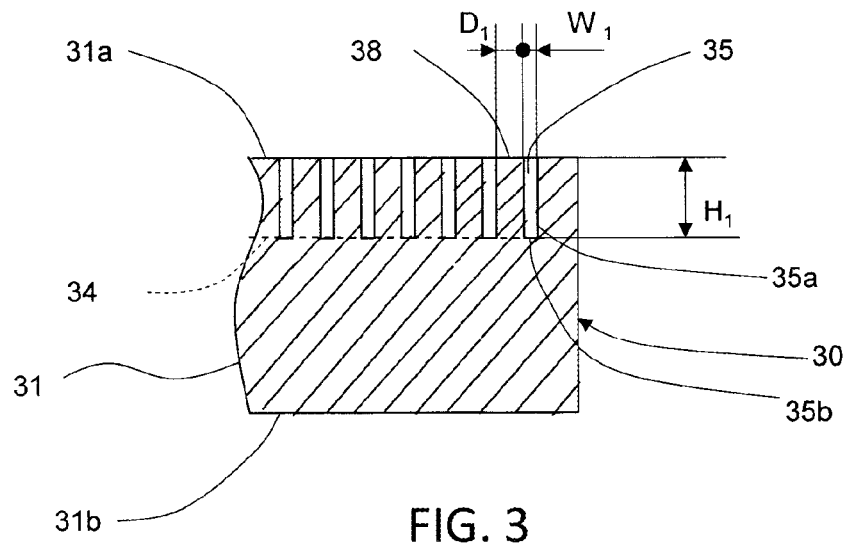
FIG. 3 is a sectional view illustrating details of capillary slits of the heater for a bonding apparatus according to the embodiment of the present invention.

Referring to FIG. 3, a width $W_1$ of the capillary slits 35 is 0.05 mm, a thickness $D_1$ of a wall 38 between the capillary slits 35 is 0.1 mm, and a depth $H_1$ of the capillary slits 35 is 0.3 mm. As described above, the width $W_1$ is smaller than the depth $H_1$ in the capillary slits 35. In this embodiment, a ratio of the depth $H_1$ with respect to the width $W_1$ is expressed by (depth $H_1$/width $W_1$)=(0.3/0.05)=6.0. Further, the depth of the depressions 34 is 0.3 mm, similarly to the capillary slits 35.

Figure 2A:
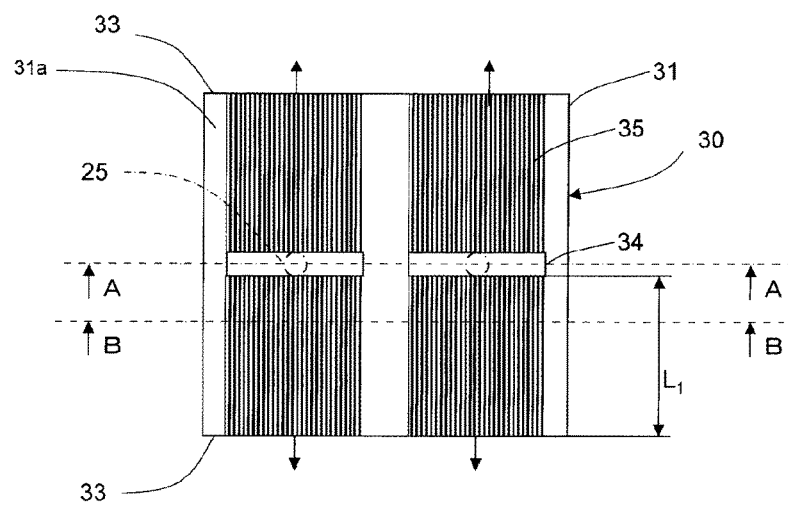
FIG. 2($a$) is a plan view illustrating the upper surface 31$a$ of the heater for a bonding apparatus 30.
Figure 2B:
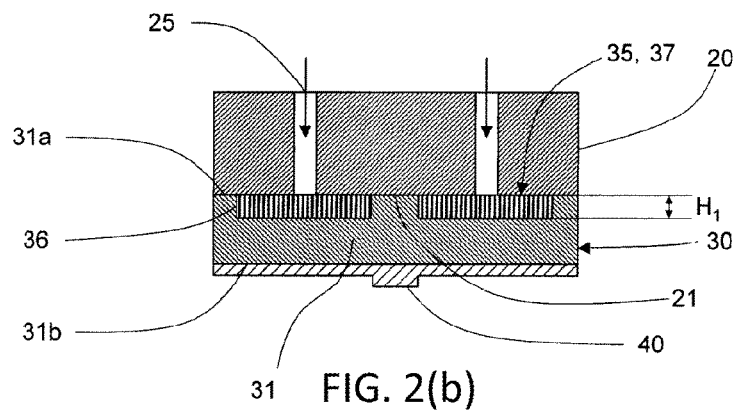
Figure 2C:
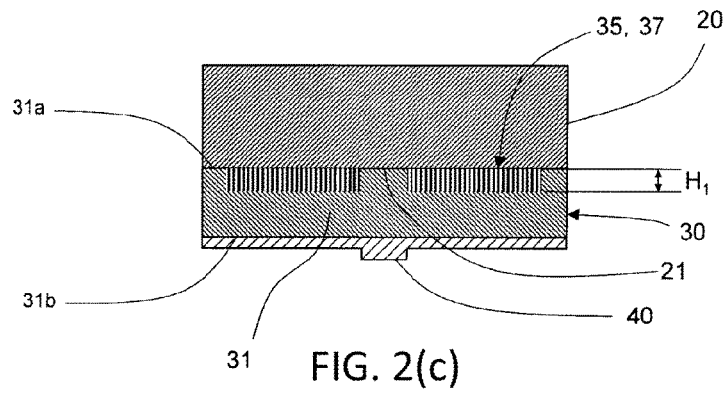

As illustrated in FIG. 2($b$) and FIG. 2($c$), the heat insulator 20 is laid over on the upper surface 31$a$ of the main body 31. The matching surface 21 of the heat insulator 20 is flat, and closely attached to a surface around the depressions 34 and the capillary slits 35 provided in the upper surface 31$a$. Accordingly, as illustrated in FIG. 2($b$), when the matching surface 21 of the heat insulator 20 is laid over the upper surface 31$a$ of the main body 31, upper opening surfaces of the substantially cuboid depressions 34 and upper opening surfaces of the capillary slits 35 are closed, and the depressions 34 and the matching surface 21 form the substantially cuboid cavities 36. Similarly, as illustrated in FIG. 2($c$), the large number of capillary slits 35 and the matching surface 21 form the large number of capillary coolant flow-paths 37 elongated in the vertical direction. Further, as illustrated in FIG. 2($b$), the heat insulator 20 is provided with two coolant air holes 25 respectively communicated with the cavities 36. As indicated by downward arrows in FIG. 2($b$), coolant air supplied to each of the coolant air holes 25 flows into the corresponding cavity 36 through the coolant air hole 25, and then into the large number of capillary coolant flow-paths 37 from the cavity 36. Then, as indicated by up-down arrows in FIG. 2(a), the coolant air flows outside through the lateral surfaces 33 to cool the heater for a bonding apparatus 30.

Figure 4:
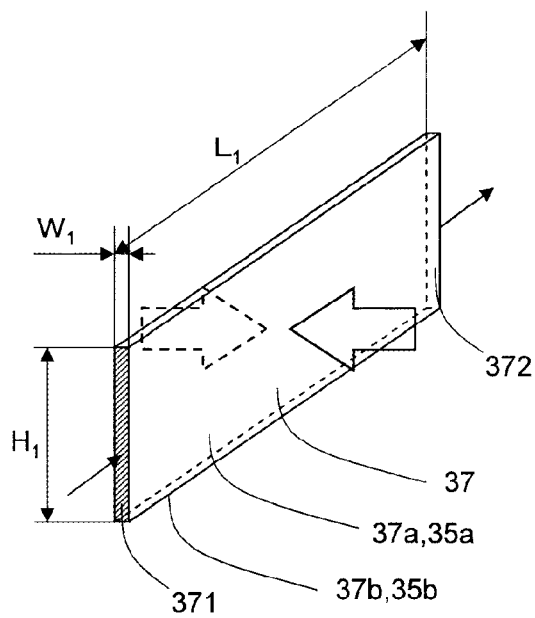
FIG. 4 is a perspective view illustrating a capillary coolant flow-path of the heater for a bonding apparatus according to the embodiment of the present invention.

Referring to FIG. 4, each of the capillary coolant flow-paths 37 of the heater for a bonding apparatus 30 of this embodiment is a flow-path having a rectangular cross-section with the width $W_1$, the depth $H_1$, and the length $L_1$, and the coolant air flows into the flow-paths through inlets 371 each communicated with the corresponding cavity 36, and exits through outlets 372 at an upper part of the lateral surfaces 33. While the width $W_1$ of the capillary coolant flow-paths 37 is as narrow as 0.05 mm, the depth $H_1$ is 0.3 mm, which is 6 times greater than the width $W_1$. Therefore, the flow of air through the capillary coolant flow-paths 37 constitutes a narrow flow between the parallel plates, and heat exchange between the main body 31 of the heater for a bonding apparatus 30 and air is mainly performed through both lateral surfaces 35a of the capillary slits 35 that constitute both lateral surfaces 37a of the capillary coolant flow-paths 37, and bottom surfaces 35b of the capillary slits 35 that constitute bottom surfaces 37b of the capillary coolant flow-paths 37 hardly contribute to the heat exchange. As the number of the capillary coolant flow-paths 37 of the heater for a bonding apparatus 30 of this embodiment is 252, an effective area for heat exchange is expressed as follows.

The effective area for heat exchange = an area of the both lateral surfaces 35a of the capillary slits 35 =

$H_1 \times L_1 \times 2 \times$ the number of the capillary coolant flow-paths 37 =

$H_1 \times L_1 \times 504$

Further, a total cross-sectional area of the capillary coolant flow-paths 37 is expressed as follows.

The total cross-sectional area of flow-paths =

$W_1 \times H_1 \times$ the number of the capillary coolant flow-paths 37 =

$W_1 \times H_1 \times 504$

Figure 5:
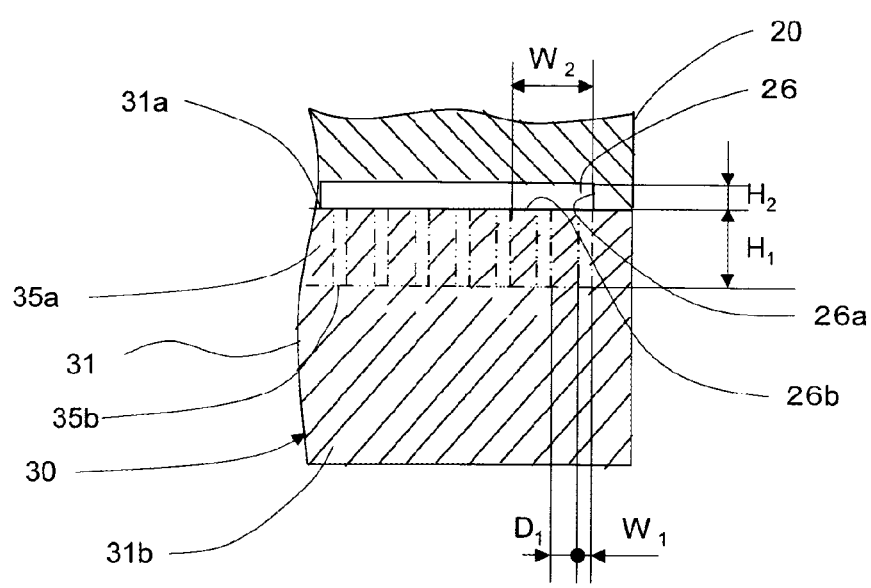
FIG. 5 is a sectional view illustrating details of a cooling groove of a heater for a bonding apparatus according to the conventional technique.

By contrast, an example illustrated in FIG. 5 in which the matching surface 21 of the heat insulator 20 is provided with a coolant-air flow-path 26 having a cross-sectional area as large as the total cross-sectional area of the capillary coolant flow-paths 37 of this embodiment is considered. In the example shown in FIG. 5, the coolant-air flow-path 26 is provided as a flow-path having no partition in a lateral direction in the figure. In this case, a total length of the width $W_1$ of the two capillary coolant flow-paths 37 and the thickness $D_1$ of the wall 38, e.g., a width $W_2$ for two pitches of the capillary coolant flow-paths 37 is (0.05+0.1)×2=0.3 mm, which is the same as the depth $H_1$ of the capillary coolant flow-paths 37, and therefore setting a height $H_2$ of the coolant-air flow-path 26 to be 0.1 mm, which is twice as large as the width $W_1$ of each capillary coolant flow-path 37, makes the cross-sectional areas of the both paths become identical. Further, as illustrated in FIG. 5, as an effective region for heat exchange of the coolant-air flow-path 26 having the width $W_2$ is only a bottom surface 26b that faces the upper surface 31a of the coolant-air flow-path 26, and lateral surfaces 26a hardly contribute to the heat exchange, an effective area for heat exchange is $W_2 \times L_1$. In addition, the effective area for heat exchange of the capillary coolant flow-paths 37 corresponding to a portion of the width $W_2$ is $H_1 \times L_1 \times 2$ (both sides)×2 (two flow-paths). Here, as $W_2$ is equal to $H_1$, the effective area for heat exchange of the capillary coolant flow-paths 37 corresponding to the portion of the width $W_2$ is fourth times as large as the effective area for heat exchange of the coolant-air flow-path 26 having the width $W_2$.

Figure 6:
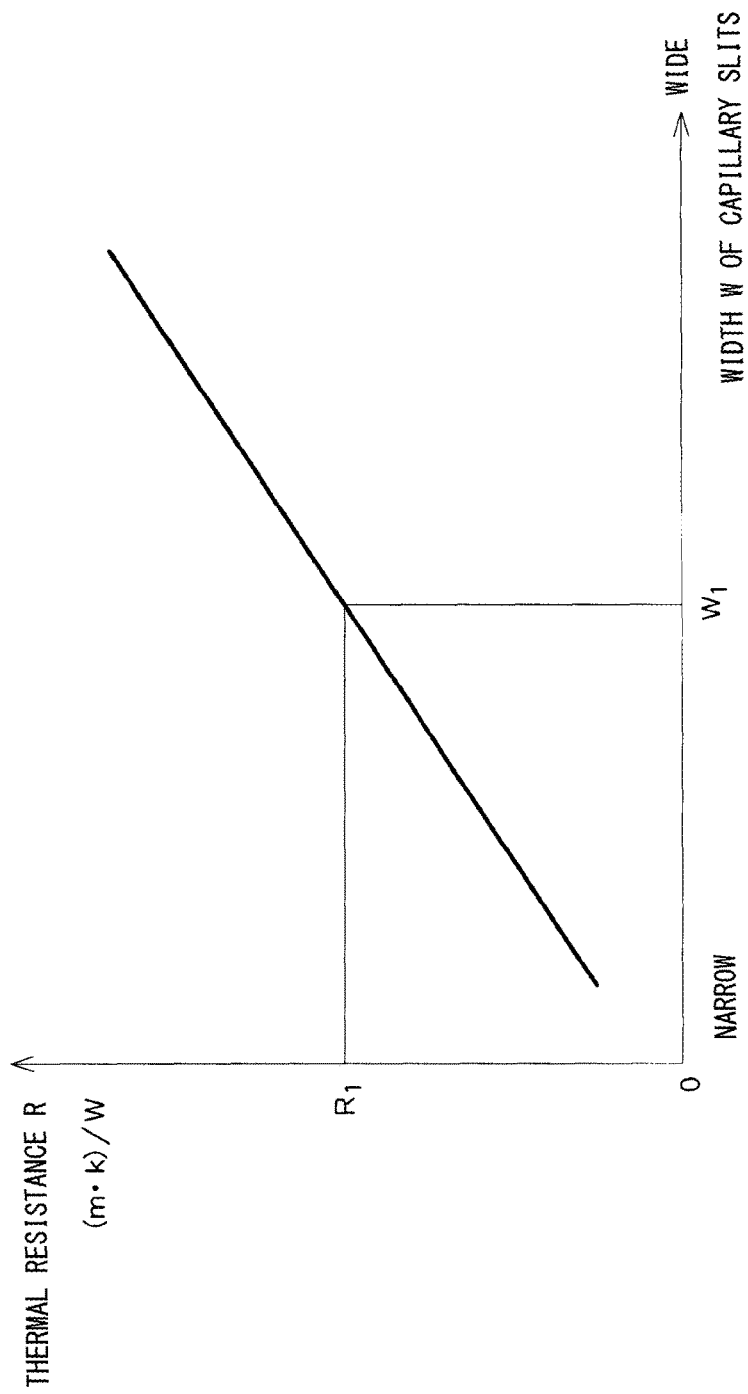
FIG. 6 is a chart showing relation between a thermal resistance and a width of the capillary slits of the heater for a bonding apparatus according to the embodiment of the present invention.

Moreover, a dominant direction of heat transfer from the both lateral surfaces 35a of the capillary slits 35 that constitute the capillary coolant flow-paths 37 to the coolant air is perpendicular to the flow, and heat transfer like a disturbed flow that is accompanied by transfer of materials is very small. Accordingly, as illustrated in FIG. 6, a thermal resistance in heat transfer increases as the width W of the capillary slits 35 increases.

Therefore, it is possible to exchange a greater amount of heat and to cool the heater for a bonding apparatus 30 more effectively with the capillary coolant flow-paths 37 of the heater for a bonding apparatus 30 of this embodiment described with reference to FIG. 1 through FIG. 4, as having the effective area for heat exchange that is fourth times as large as that of the coolant-air flow-path 26 according to the conventional technique described with reference to FIG. 5 as well as a thermal resistance smaller than that of the coolant-air flow-path 26.

Figure 7B:
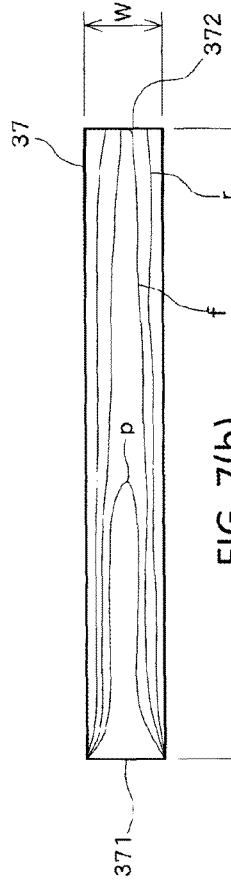
FIG. 7($a$) is a chart showing a change in the air temperature with respect to a length in a longitudinal direction of the capillary coolant flow-paths along a center in a width direction.
Figure 7A:
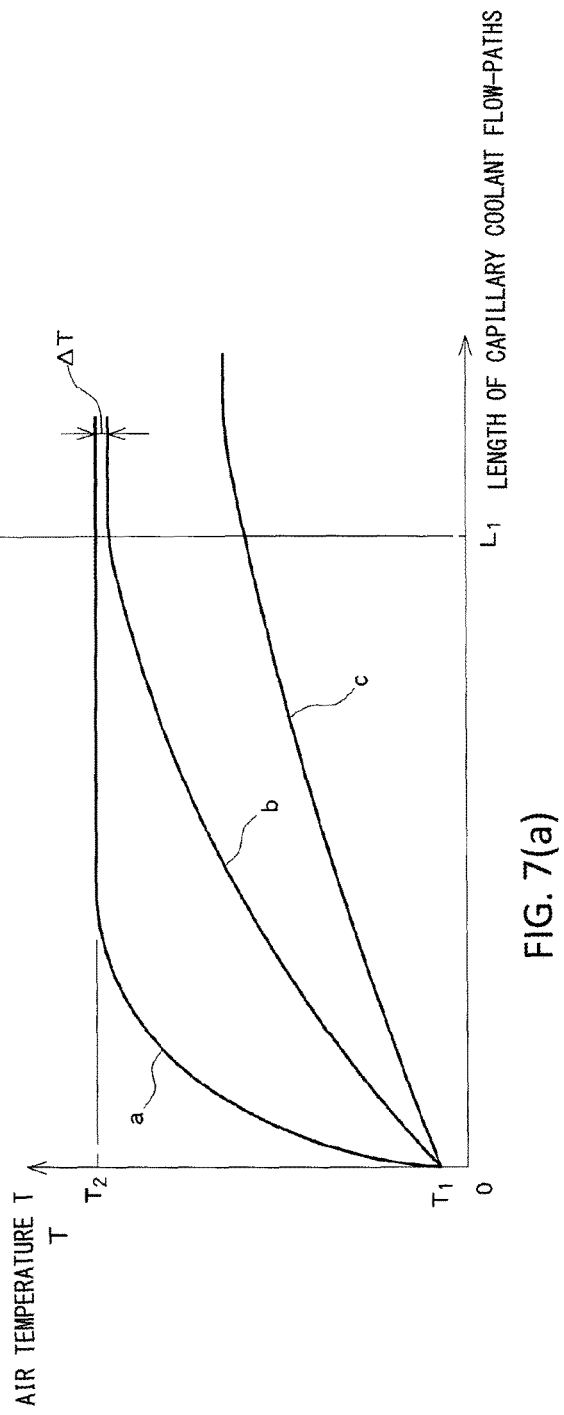

As shown in FIGS. 7(a) and 7(b), a temperature within the capillary coolant flow-paths 37 of the heater for a bonding apparatus 30 of this embodiment changes according to a position in the capillary coolant flow-paths 37 in a direction of the flow and a flow rate of air. FIG. 7(a) is a chart showing a change in the air temperature with respect to a length in a longitudinal direction of the capillary coolant flow-paths 37 along a center in a width direction, and FIG. 7(b) shows positions at which the air temperature within the capillary coolant flow-paths 37 corresponds to a temperature $T_2$ of wall surfaces (wall surfaces of the capillary slits 35). When the flow rate air is small, as shown by a line a FIG. 7(a) and a line p in FIG. 7(b), the temperature of air that flows into the inlets 371 of the capillary coolant flow-paths 37 at a temperature $T_1$ increases quickly, and rises up to the temperature $T_2$ of the wall surfaces (wall surfaces of the capillary slits 35) of the capillary coolant flow-paths 37 by a first half of the flow-paths, and the air flows out through the outlets 372 at this temperature. In this case, it is not possible to remove heat from the main body 31 in a latter half of the flow-paths as the air temperature already reaches the temperature $T_2$ of the wall surfaces, and a cooling capability is not fully exerted.

By contrast, when the flow rate air is large, as shown by a line c in FIG. 7(a) and a line r in FIG. 7(b), air that flows into the inlets 371 at the temperature $T_1$ flows outside through the outlets 372 at a temperature about half of the temperature $T_2$ of the wall surfaces. In this case, while the cooling capacity increases as a temperature difference between the air and the wall surfaces (wall surfaces of the capillary slits 35) is large over an entire length of the capillary coolant flow-paths 37, an increase of the cooling capacity is not very large for the flow rate of the coolant air.

Thus, according to the heater for a bonding apparatus 30 of this embodiment, the flow rate of air is controlled such that the temperature of air that flows outside through the outlets 372 of the capillary coolant flow-paths 37 becomes lower than the temperature $T_2$ of the wall surfaces (wall surfaces of the capillary slits 35) slightly, or by a predetermined threshold value ΔT. The flow rate can be previously determined based on examinations or the like, and can be controlled to be the determined flow rate by adjusting a pressure of air supplied to the coolant air holes 25 or by using a flow-rate control valve or a regulator provided on an inlet side of the coolant air holes 25. By controlling the flow rate of the coolant air in this manner, it is possible to effectively cool the heater for a bonding apparatus 30 with a smaller flow rate of the coolant air.

Figure 8:
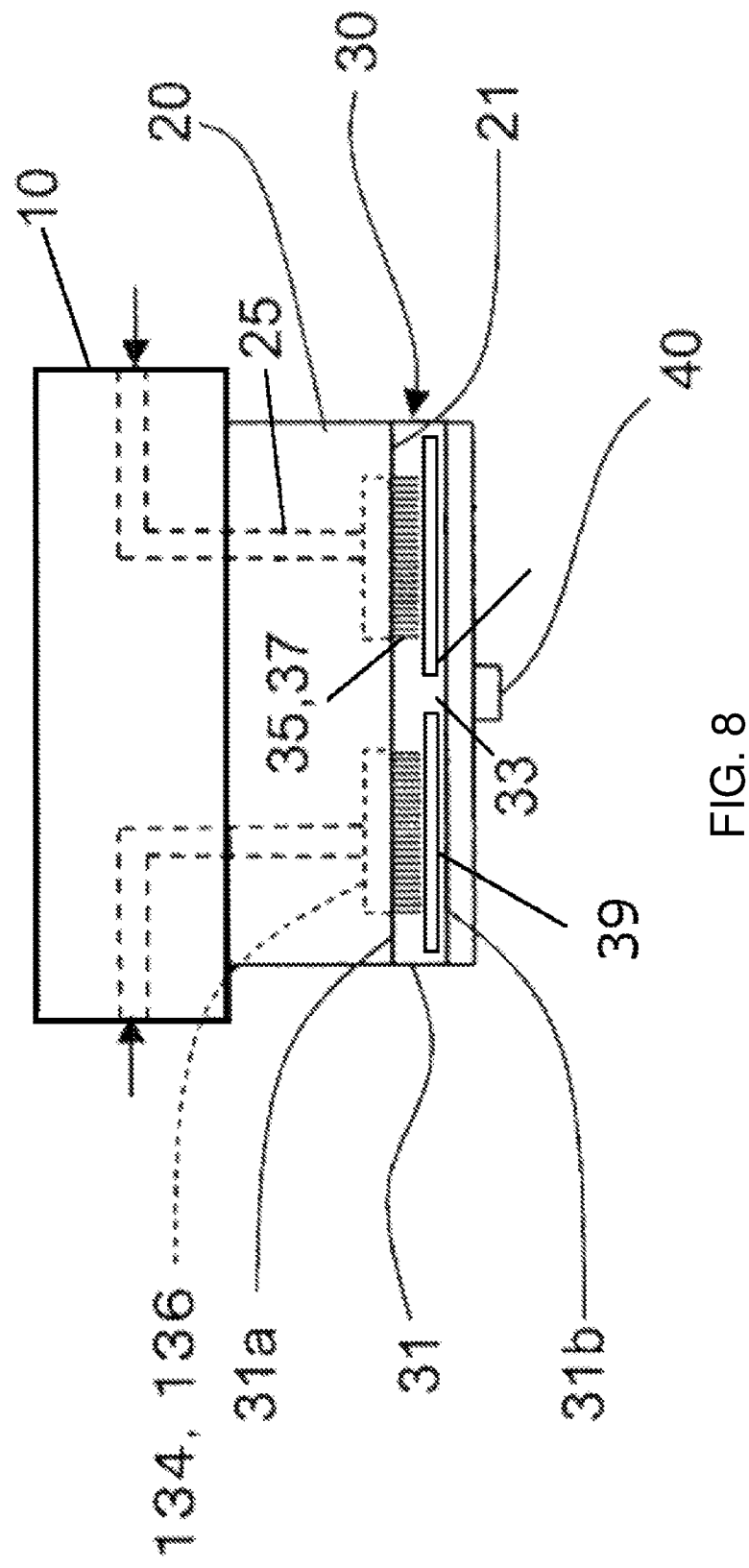
FIG. 8 is an illustrative diagram illustrating a configuration of a heater for a bonding apparatus according to a different embodiment of the present invention.
Figure 9A:
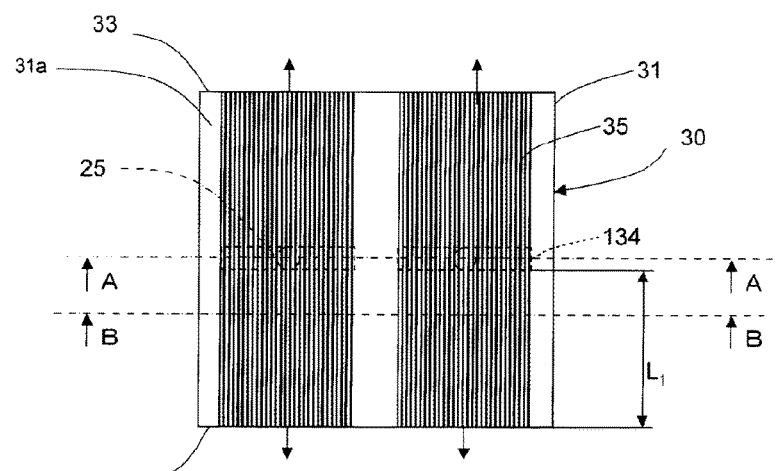
FIG. 9$a$ shows a plan view the heater for a bonding apparatus according to the different embodiment of the present invention.

Hereinafter, a different embodiment of the present invention will be described with reference to FIG. 8 and FIG. 9(c). Like components as in the embodiment described above with reference to FIG. 1 through FIG. FIG. 7(b) will be denoted by like reference numerals, and description of these components shall be omitted. Referring to FIG. 8, in this embodiment, the matching surface 21 of the heat insulator 20 is provided with a depression 134 as a second depression near the center of the surface. As illustrated in FIG. 9(a), the capillary slits 35 provided for the main body 31 extend from one of the lateral surfaces 33 to the other of the lateral surfaces 33 on an opposite side. To the depression 134, the coolant air holes 25 are connected, respectively. A number, a width, and a depth of the capillary slits 35 are the same as those in the embodiment described above with reference to FIG. 1 through FIG. 7(b).

Figure 9B:
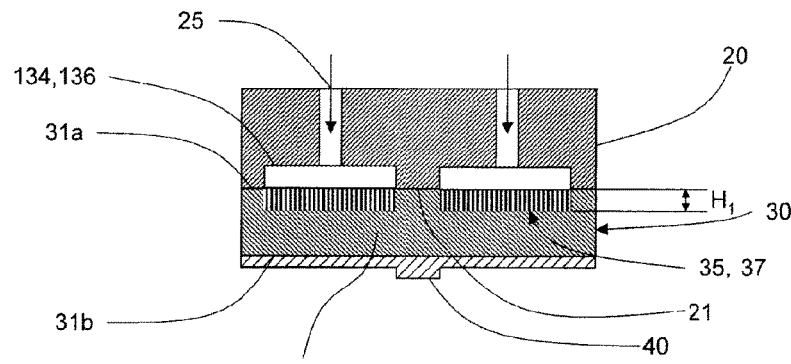
Figure 9C:
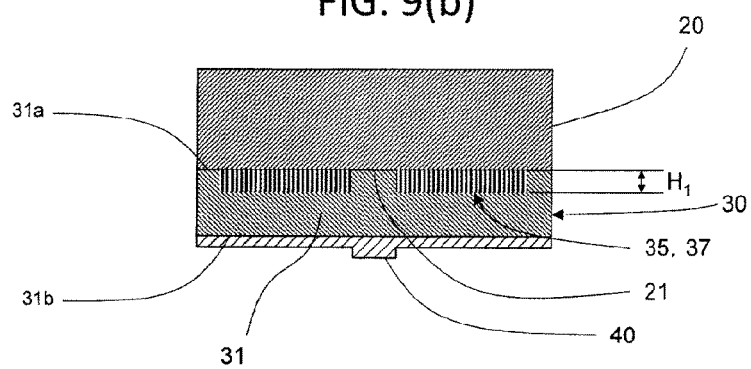

As illustrated in FIG. 8 and FIG. 9(b), when the matching surface 21 of the heat insulator 20 is laid over the upper surface 31a of the main body 31, each of the depressions 134 provided in the matching surface 21 of the heat insulator 20 is closely attached to a portion of the upper surface 31a of the main body 31 where the capillary slits 35 are not provided to form a cavity 136 into which air enters through the coolant air holes 25. As illustrated in FIG. 9(c), the slits 35 and the matching surface 21 of the heat insulator 20 form the capillary coolant flow-paths 37. As illustrated in FIG. 9(a), the length of the capillary coolant flow-paths 37 is $L_1$. As illustrated in FIG. 9(b), lower surfaces of the cavities 136 are communicated with opening ends at an upper end of the large number of slits 35. Further, air entering the cavities 136 through the coolant air holes 25 flows downward into the slits 35 from the cavities 136, and then as illustrated in FIG. 9(a), flows through the capillary coolant flow-paths 37 toward the lateral surfaces 33 to cool the heater for a bonding apparatus 30.

This embodiment provides an advantageous effect of allowing a simpler configuration, as the main body 31 made of ceramic is easily-worked, in addition to the same effect as in the embodiment described above with reference to FIG. 1 through FIG. 7(b).

In the embodiments described above, the width $W_1$ of the capillary slits 35 is described to be 0.05 mm, but the width $W_1$ of the capillary slits 35 can be freely selected within a range from 0.5 mm to 0.01 mm. It is more preferable if the width $W_1$ is within a range from 0.1 mm to 0.02 mm, and even more preferable if the width $W_1$ is within a range from 0.05 mm to 0.02 mm. Further, the depth $H_1$ of the capillary slits 35 is described to be 0.3 mm, and the ratio between the width $W_1$ of the capillary slits 35 and the depth $H_1$ of the capillary slits 35 is described to be 1:6. However, the depth $H_1$ of the capillary slits 35 can be any depth as long as it is greater than the width $W_1$ of the capillary slits 35, and can be freely selected within a range from 1.0 mm to 0.1 mm, for example. In addition, the ratio between the width $W_1$ of the capillary slits 35 and the depth $H_1$ of the capillary slits 35 is not limited to 1:6, and can be freely selected within a range from 1:3 to 1:10.

The present invention is not limited to the embodiments described above, and includes any modifications and alterations without departing from the technical scope and the spirit of the present invention formed by the appended claims.

REFERENCE SIGNS LIST

10: Base Member
20: Heat Insulator
21: Matching Surface
25: Coolant Air Hole
26: Coolant-Air Flow-Path
30: Heater for Bonding Apparatus
31: Main Body
31a: Upper Surface
31b: Lower Surface
33: Lateral surface
34, 134: Depression
35: Capillary Slit
35a, 37a: Lateral surface
35b, 37b: Bottom Surface
36, 136: Cavity
37: Capillary Coolant Flow-Path
38: Wall
40: Bonding Tool
371: Inlet
372: Outlet

The invention claimed is:

1. A heater for a bonding apparatus, the heater comprising:
   a heat insulator comprising a coolant air hole,
   a body comprising a ceramic material body and a heating element,
      the heating element serving as an exothermic resistance body embedded within the ceramic material body, and
      the ceramic material body comprising a plate-like shape, the plate-like shape comprising a first surface and a second surface,
         the first surface being configured to attach a bonding tool, and
         the second surface being opposite the first surface and being attached to the heat insulator, and
   a plurality of capillary slits penetrating the body along the second surface,
      each capillary slit comprising a width and a depth,
         the width being along the second surface and within a range from 0.01 mm to 0.5 mm, and the width being smaller than the depth, and
         the depth being into the second surface in a substantially perpendicular direction to the second surface,
      wherein the plurality of capillary slits and a matching surface of the heat insulator attached to the second surface form a plurality of capillary coolant flow-paths,
         the plurality of capillary coolant flow-paths cooling directly the heated heater by a coolant air flow that enters though the coolant air hole, and
         the coolant air hole opening to the second surface in the depth direction of the capillary slits.

2. The heater for a bonding apparatus according to claim 1, wherein the second surface is provided with a depression near a center thereof, the depression and the matching surface of the heat insulator attached to the second surface form a cavity into which coolant air flows, and each of the large number of capillary slits extends from the cavity to a lateral surface.

3. A bonding apparatus comprising:
a bonding head comprising:
- a heater comprising a coolant air hole, and
- a bonding tool,
- wherein the heater further comprises a heat insulator, an exothermic resistance body, a ceramic material, and a plurality of capillary slits,
  - the exothermic resistance body being embedded within the ceramic material,
  - the ceramic material being formed in a plate-like shape, the plate-like shape comprising a first surface and a second surface,
    - the first surface being attached to the bonding tool,
    - the second surface being opposite the first surface and being attached to the heat insulator, and
    - the coolant air hole opening to the second surface,
  - the plurality of capillary slits disposed in the second surface,
    - each capillary slit comprising a length, a width, and a depth,
      - the length being along the second surface and extending between opposing lateral surfaces of the heater,
      - the width being along the second surface, and the width being smaller than the depth,
      - the depth being provided into the second surface in a substantially perpendicular direction to the second surface, and
      - the length and width extending in a substantially perpendicular direction to the primary axis of the coolant air hole at its opening to the second surface, and
  - the heat insulator comprising a matching surface attached to the second surface,
  - wherein, in combination, the plurality of capillary slits and the matching surface form a plurality of capillary coolant flow-paths,
    - the plurality of capillary coolant flow-paths cooling directly the heated heater by a coolant air flow that enters through the coolant air hole, and
  - wherein the heat insulator comprises a depression near a center of the matching surface,
    - the depression and the second surface forming a cavity into which coolant air flows, and
    - each of the capillary slits being in communication with the cavity, and
  - wherein the coolant air hole opens toward a depth direction of the capillary slits.

4. A heating assembly for a bonding apparatus, the heating assembly comprising:
a heater, and
a bonding tool,
wherein the heater comprises a heat insulator and a body,
the heat insulator comprising a coolant air hole,
the body comprising a ceramic material body and a heating element,
  the heating element serving as an exothermic resistance body embedded within the ceramic material, and
  the ceramic material body comprising a plate-like shape the plate-like shape comprising a first surface and a second surface,
    the first surface being configured to attach to the bonding tool; and
    the second surface being opposite the first surface and being attached to the heat insulator, and
a plurality of capillary slits disposed in the second surface,
  each capillary slit comprising a width and a depth,
    the width being along the second surface, and the width being smaller than the depth, and
    the depth being provided into the second surface in a substantially perpendicular direction to the second surface, and
wherein the heat insulator further comprises a matching surface attached to the second surface,
  wherein, in combination, the plurality of capillary slits and the matching surface form a plurality of capillary coolant flow-paths,
    the plurality of capillary coolant flow-paths cooling directly the heater by a coolant air flow that enters through the coolant air hole, and
  wherein the coolant air hole opens toward a depth direction of the capillary slits.

5. The heater for a bonding apparatus according to claim 1, wherein the ceramic material is made of an aluminum nitride.

6. The heater for a bonding apparatus according to claim 1, wherein the exothermic resistance body is made of one of platinum or tungsten.

7. The heater for a bonding apparatus according to claim 1, wherein a ratio of the width to the depth is within a range of 1:3 to 1:10.

8. The heater for a bonding apparatus according to claim 1,
wherein the width of each capillary slit extends along the second surface in a longitudinal direction, and
wherein each capillary slit comprises a length, the length being along the second surface and extending from a depression near a center of the body toward opposing lateral surfaces of the body in a substantially perpendicular direction to the primary axis of the coolant air hole.

9. The heater for a bonding apparatus according to claim 1,
wherein the depth of each capillary slit does not extend through to the first surface, and
wherein the coolant airflow exits the coolant air hole substantially in the depth direction.

* * * * *